(12) United States Patent
Xiang et al.

(10) Patent No.: US 8,371,860 B2
(45) Date of Patent: Feb. 12, 2013

(54) METHOD FOR REDUCING THE FITTING THRUST OF GOLDEN FINGER AND PCB

(75) Inventors: Jiying Xiang, Shenzhen (CN); Shiju Sui, Shenzhen (CN); Weifeng Zhang, Shenzhen (CN); Dandan Guo, Shenzhen (CN); Nanfang Li, Shenzhen (CN)

(73) Assignee: ZTE Corporation, Shenzhen, Guangdong Province (CN)

( * ) Notice: Subject to any disclaimer, the term of this patent is extended or adjusted under 35 U.S.C. 154(b) by 0 days.

(21) Appl. No.: 12/920,081

(22) PCT Filed: Oct. 24, 2008

(86) PCT No.: PCT/CN2008/072825
§ 371 (c)(1),
(2), (4) Date: Aug. 27, 2010

(87) PCT Pub. No.: WO2009/105952
PCT Pub. Date: Sep. 3, 2009

(65) Prior Publication Data
US 2011/0003487 A1 Jan. 6, 2011

(30) Foreign Application Priority Data
Feb. 29, 2008 (CN) .......................... 2008 1 0006358

(51) Int. Cl.
*H01R 12/00* (2006.01)
(52) U.S. Cl. ...................................... 439/60
(58) Field of Classification Search ................... 439/60, 439/59, 924.1, 924.2, 951; 29/854
See application file for complete search history.

(56) References Cited

U.S. PATENT DOCUMENTS

| | | | | |
|---|---|---|---|---|
| 2,959,758 A | * | 11/1960 | Kehl et al. | 439/55 |
| 3,160,455 A | * | 12/1964 | Mayon et al. | 439/60 |
| 3,432,795 A | * | 3/1969 | Jayne | 439/60 |
| 4,106,841 A | * | 8/1978 | Vladic | 439/188 |
| 5,239,748 A | * | 8/1993 | Hamilton | 29/843 |
| 5,692,910 A | * | 12/1997 | Mittal | 439/59 |
| 5,941,715 A | * | 8/1999 | Huang | 439/60 |
| 6,149,468 A | * | 11/2000 | Meng | 439/637 |
| 6,227,867 B1 | | 5/2001 | Chen et al. | |
| 6,390,857 B1 | | 5/2002 | Pickles et al. | |
| 6,452,114 B1 | * | 9/2002 | Schweitzer et al. | 174/261 |

(Continued)

FOREIGN PATENT DOCUMENTS

| | | |
|---|---|---|
| CN | 2446678 Y | 9/2001 |
| CN | 2490726 Y | 5/2002 |

*Primary Examiner* — Edwin A. Leon
*Assistant Examiner* — Harshad Patel
(74) *Attorney, Agent, or Firm* — Bright IP Law Offices (57) ABSTRACT

A method for reducing the fitting thrust of golden finger (101,103) and a PCB (100). The method and the PCB (100) solve the problem of excessive inserting force of the golden finger (101,103) of the prior art, through modifying the shape of the edge of the PCB (100), the edge of the PCB open reeds of a connector (201, 203) at different time. The PCB (100) has at least one concave edge section or at least one convex edge section or at least one tilt edge section, and the edge can further be beveled. The bonding pads of the golden finger can be assorted, pin ends of a part of golden fingers (101, 103) can be partially removed or these golden fingers can be completely removed, the pin ends of a part of golden fingers (101,103) can be preserved. Through the method, the purpose of reducing the fitting thrust upon inserting the PCB (100) into the connector can be achieved.

13 Claims, 12 Drawing Sheets

U.S. PATENT DOCUMENTS

| | | | |
|---|---|---|---|
| 6,736,678 B2 * | 5/2004 | Yao | 439/638 |
| 6,855,891 B2 * | 2/2005 | Eguchi et al. | 174/250 |
| 6,896,523 B2 * | 5/2005 | Nishizawa et al. | 439/60 |
| 6,939,182 B1 * | 9/2005 | Wen et al. | 439/678 |
| 6,953,350 B2 * | 10/2005 | Shiu | 439/79 |
| 6,994,563 B2 * | 2/2006 | Amini et al. | 439/62 |
| 7,233,060 B2 | 6/2007 | Wu et al. | |
| 7,453,338 B2 * | 11/2008 | Aronson | 333/260 |
| 2004/0123458 A1 * | 7/2004 | Korsunsky et al. | 29/874 |
| 2007/0099443 A1 * | 5/2007 | Pax | 439/55 |

* cited by examiner

METHOD FOR REDUCING THE FITTING THRUST OF GOLDEN FINGER AND PCB

CROSS-REFERENCE TO RELATED APPLICATIONS

This application is a U.S. national phase application under the provisions of 35 U.S.C. §371 of International Patent Application No. PCT/CN08/72825 filed Oct. 24, 2008, which in turn claims priority of Chinese Patent Application No. 200810006358.X filed Feb. 29, 2008. The disclosures of such international patent application and Chinese priority patent application are hereby incorporated herein by reference in their respective entireties, for all purposes.

FIELD OF THE INVENTION

The present invention relates to the design and manufacture of the hardware circuit, in particular to a method capable of reducing the fitting thrust of golden finger and a printed circuit board (PCB).

BACKGROUND OF THE INVENTION

Golden finger is a commonly used method for hardware connection in the computer hardware industry, which is used, for example, in the memory bank, the PC boards and so on, i.e., some bonding pads are made onto a PCB directly, then the PCB is directly inserted to a connector in which the reeds snap to the bonding pads of the PCB, so as to ensure an electrical connection. In order to increase abrasion resistance and stability, a gold plating process is applied on the bonding pads of the PCB, such that the bonding pads are referred to as the golden finger.

In recent years, the application of the golden finger is extended to the non-computer industries such as the communication industry. For example, the golden finger as a connection manner has been early or late employed in the AMC (Advanced Mezzanine Card) standard, the ATCA (Advanced Telecommunications Computing Architecture) standard and the MicroTCA (Micro Telecommunications Computing Architecture) standard established by the PICMG (PCI Industrial Computer Manufacturers Group).

As the increased application of the golden finger in the non-computer industries, some inherent problems of the golden finger connection emerge, one of which is that, since the number of times of the reliable inserting/removing operations required in the non-computer industries is much greater than that required in the computer industry (for example, the AMC standard specifies the number of times of the reliable inserting/removing operations is 200, while that required by the computer products is normally less than 20), a more tight cooperation between the connector and the golden finger is required, which will result in an excessive inserting/removing force.

Although having recognized the problem, what the standard organization can do is only to loose the standard of the allowable inserting force rather than to provide a solution to reduce the inserting/removing force, for example, the AMC standard specifies that as long as the maximum inserting force is less than 100 N, it is regarded as qualified, however, the inserting force for fitting the PCB of the golden finger connector in the prior art is more than 50 N. The inserting force will be doubled for the PCB with two connectors, and tripled for three connectors. According to the MicroTCA standard, there are 4 connectors on the MCH (MicroTCA carrier hub), thus the thrust force will be quadrupled, which has gone beyond the manual operation limitation. As the wide applications of the MicroTCA standard, the problem will emerge definitely.

An investigation shows that the reason of the excessive inserting force of the golden finger lies in that the connector reeds (spring leaves) are required to resist the opening force of the reeds of the golden finger when fitting with the golden finger. However, according to the current standards (AMC, MicroTCA, etc.), both the connectors and the PCBs have a right angle structure, and all of the golden fingers are opened at the same time, thus there will generate an extreme peak thrust force at the moment of fitting. For example, for the AMC standard, there are 170 reeds, thus the instantaneous maximum thrust force is 170 times of that of a single reed.

Figure 1:
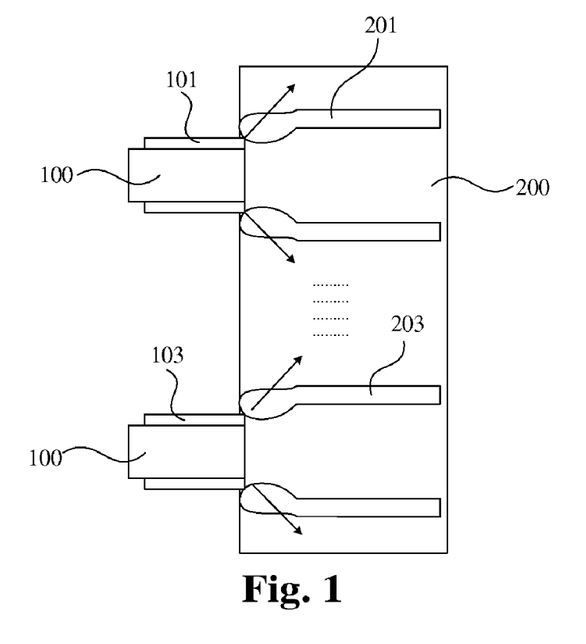
FIG. 1 is a schematic diagram showing the fitting between the golden finger and the connector of the prior art.

FIG. 1 is the schematic diagram showing the fitting between the golden finger and the connector in the prior art, wherein two golden fingers 101 and 103 are shown to be un-overlapped and in different planes for clarity. The two golden fingers 101 and 103 respectively contact with two reeds 201, 203 of the connector 200 at the same time, the thrust force at this time is twice of the thrust force of the single golden finger.

After the reeds open, the thrust force is used to counteract the sliding friction force, and the required thrust force is substantially reduced at this time. Therefore, as to the problem of the excessive thrust force, it is necessary to solve the tremendous thrust force required when the golden fingers open.

SUMMARY OF THE PRESENT INVENTION

The main purpose of the present invention is to solve the excessive inserting force of the golden fingers in the prior art by providing a method for reducing the fitting thrust and a PCB.

To this end, according to one aspect of the present invention, modifying the shape of a edge of a PCB such that the edge of the PCB do not push open reeds of the connector at the same time, that is to say, different reeds are cleaved at different time so as to reduce the resistance.

Preferably, said PCB comprises at least one concave edge section, or at least one convex edge section, or at least one tilted edge section. Herein, a recess shape is used to guide a single connector, or in the case that there is a plurality of connectors, these connectors are guide through the positioning relationships among them. In addition, the convex or concave edge can be utilized to provide pre-reserved buffer regions. Furthermore, for example, these buffer regions can be made have beveled shape.

Preferably, said edge of said PCB comprises two concave edge sections with the same shape, or two convex edge sections or two tilted edge sections, and said two concave edge sections (also referred as depressed or recessed sections) or said two convex edge sections or tilted edge sections are symmetrical with respect to the locating part of the PCB. The two edge sections may be, for example, the two concave edge sections, the two convex edge sections or the two tilted edge sections or the combination thereof.

Preferably, the PCB may comprise at least two edge sections, and the edge of the PCB is arranged in a staircase shape.

Preferably, the golden finger bonding pads can be assorted, i.e., the pin ends of some golden fingers being removed, and the pin ends of some golden fingers being reserved. For example, as to the case that the PCB contraction affects the original end portion of the golden finger bonding pads, in order to ensure the communication performance of the signal, rather than removing all golden finger ends, the end portion of the longer golden finger bonding pads on the same PCB are reserved.

According to another aspect of the present invention, the PCB edge is beveled, i.e., the beveling is performed in the vertical section of the PCB, so as to the reeds open gradually rather than suddenly, to reduce the maximum thrust. The beveling may extend to the golden finger bonding pads or extend on the edge area outside of the edge of the golden finger bonding pads.

According to another aspect of the present invention, the golden finger bonding pads can be assorted, i.e., the portion of the pin ends of some golden fingers being removed or these golden fingers being totally removed, and the portion of the pin ends of some golden fingers being reserved. By assorting the golden fingers, a part of the pins need not to be firstly contact are selected and the golden finger portion on the ends of these pins are removed, so as to reduce thickness and thus the friction force. Since the golden fingers have different lengths, they subject to forces at different time when fitting with the connectors, thus the maximum thrust is reduced.

The present invention also provides a PCB used for above method, in the PCB, the golden finger ends on the edge of the PCB are positioned at different inserting locations in order to open reeds of a connector at different time. In particular, the PCB may have at least one concave edge section or at least one convex edge section or at least one tilted edge section. Said edge can be further beveled. However, it should be understood that the definition to the shape of the edge throughout the context means that these edges are mainly used to reduce or decrease the fitting thrust and also used for the purpose of locating, therefore, which are different from the shapes of the edge for locating in the PCB of the prior art.

It is to be understood that the general description above and the detailed description below are intended to exemplify and illustrate, so as to provide a further explanation to the present invention to be protected.

Other features and advantages of the present invention will be detailed in the description, and partly obvious from the description, or can be understood through implementing the present invention. The purposes and other advantages can be achieved and obtained through the structure specified by the specification, claims and drawings.

BRIEF DESCRIPTION OF THE DRAWINGS

Drawings are provided for the further understanding of the present invention and form a part of the specification, which are used to illustrate some embodiments of the present invention and explain the principle of the present invention together with the specification, wherein

FIGS. 3-1 to 3-9 are top views of the PCB improved according to the present invention;

FIGS. 4-1 to 4-3 are section views showing the process of inserting the golden fingers of the PCB improved according to the present invention;

FIGS. 6-1 to 6-3 are diagrams showing plugging/unplugging guide of the PCB improved according to the present invention;

FIGS. 8-1 and 8-2 are top views respectively showing the PCB with flushed golden fingers and the PCB with un-flushed golden fingers;

FIGS. 9-1 and 9-2 are section views showing the contacting between the connector reeds and the flushed golden fingers and the un-flushed golden fingers;

FIGS. 11-1 and 11-2 are sectional schematic views showing the beveled PCB being inserted into the connector reeds.

DETAILED DESCRIPTION

The present invention will be described in detail by referring to drawings.

Considering the problem of the excessive inserting force, there is provided an improved solution which makes the resistance of opening each reed impose to the PCB at different time, so as to reduce the instantaneous maximum resistance.

Figure 2:
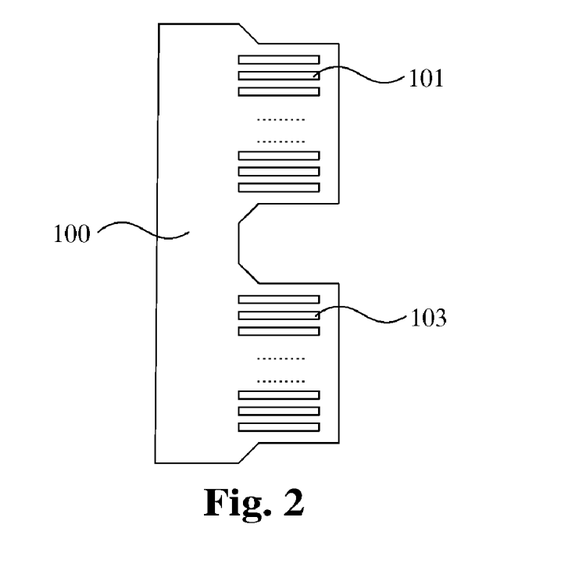
FIG. 2 is the top view of the PCB with the gold fingers of the prior art.

FIG. 2 shows the PCB 100 which is manufactured strictly according to related standards, wherein all the golden fingers 101, 103 and each part of these golden fingers are flushed, therefore an instantaneous maximum resistance will occur when the golden fingers are connecting with a standard connector.

It is to be noted that although FIG. 1 only shows the case of two golden fingers connectors, the cases of one golden finger, three golden fingers, or more golden fingers are similar. It is the same hereinafter.

In addition, FIG. 2 only shows the case that a plurality of golden fingers arranged in one plane, but it is also similar for the case that the golden fingers are arranged in different planes (in particular, for example, the definition for the MCH connector in the MicroTCA standard). It is the same hereinafter.

FIGS. 3-1 to 3-9 show the embodiments of the un-flushed golden fingers according to the present application. It is to be noted that, the profiles which could be employed comprise but not limit to above listed shapes, and are all contained in the protection scope of the present application, as long as the edge of the PCB contact with the connectors at different time.

Figure 31:
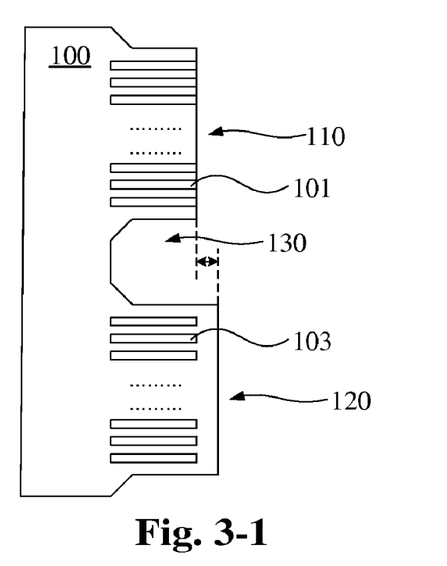

In FIG. 3-1, the PCB 100 comprises a first edge section 110 which is straight, a second edge section 120 which is straight and a locating portion 130, wherein the first edge section 110 and the second edge section 120 are arranged in a staircase form, such that the golden fingers 103 on the second edge section 120 contact the connector reeds firstly, and then the golden fingers 101 on the first edge section 110 contact the connector reeds secondly when the PCB is inserted into the connector, so as to reduce the maximum fitting thrust.

Figure 32:
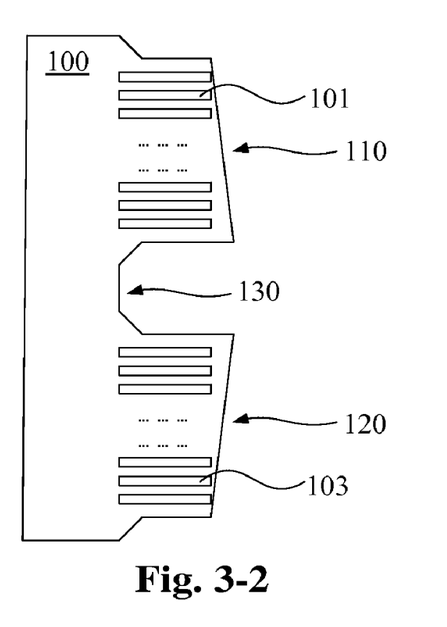

In FIG. 3-2, both the first edge section 110 and the second edge section 120 are tilted and symmetrical with respect to the locating portion 130, and the first edge section and the second edge section present a convex shape as a whole.

Figure 33:
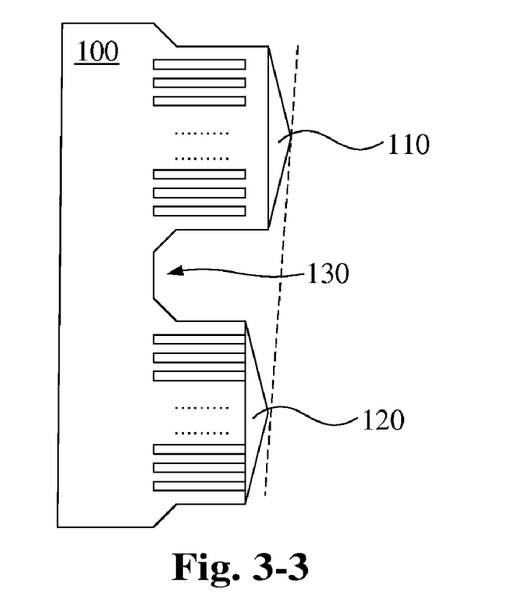

In FIG. 3-3, the first edge section 110 and the second edge section 120 respectively have a convex angle shape, and the first edge section 110 extends outward more than the second section 120 as a whole.

Figure 34:
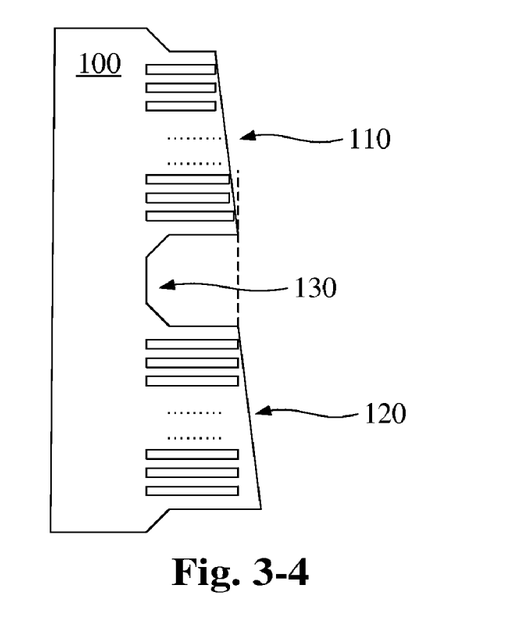

In FIG. 3-4, both the first edge section 110 and the second edge section 120 are tilted, and the second edge section 120 extends outward more than the first section 110 as a whole.

Figure 35:
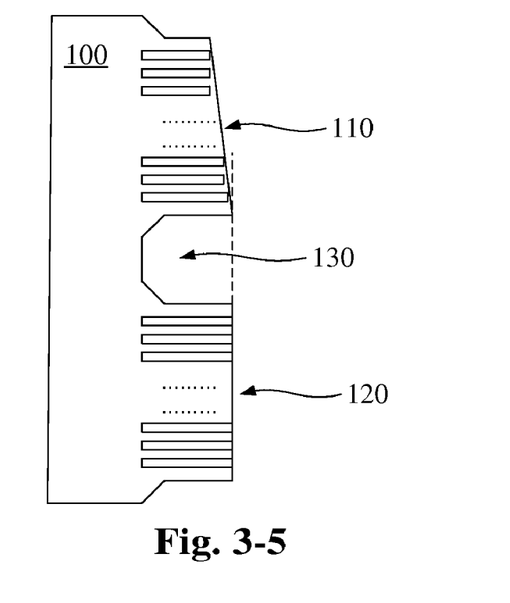

In FIG. 3-5, the first edge section 110 is tilted, while the second edge section 120 is straight.

Figure 36:
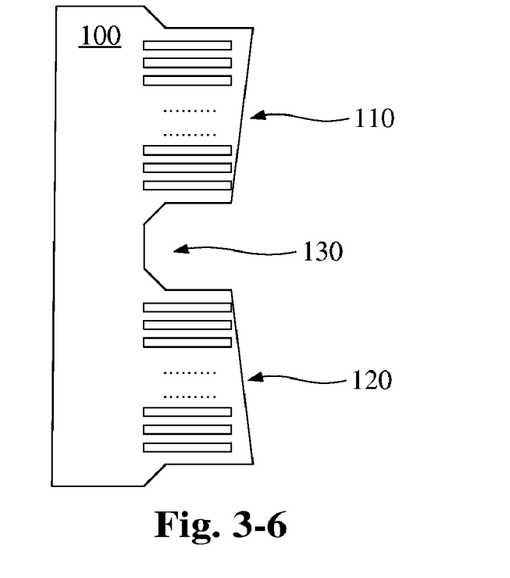

In FIG. 3-6, both the first edge section 110 and the second section 120 are tilted, and the first edge section and the second section present a concave shape as a whole.

Figure 37:
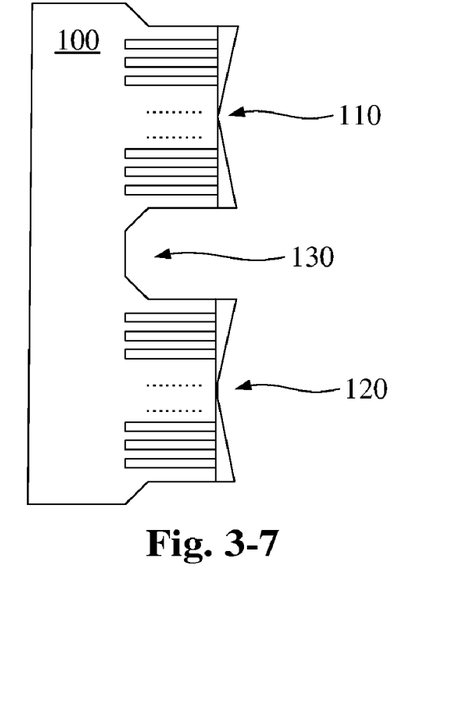

In FIG. 3-7, the first edge section 110 and the second section 120 respectively have a concave angle shape, and the first edge section 110 and the second edge section 120 are symmetrical with respect to the locating portion 130.

Figure 38:
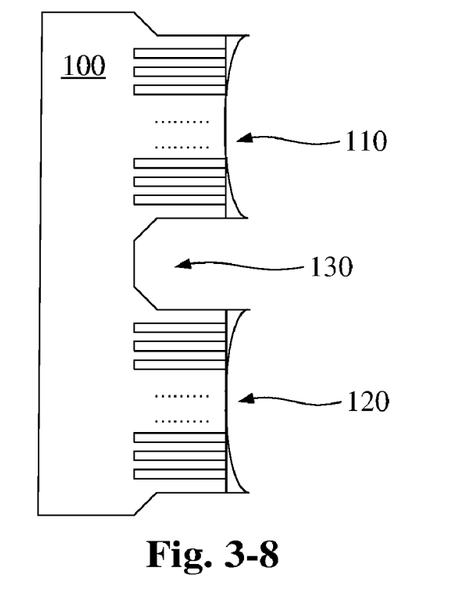

In FIG. 3-8, the first edge section 110 and the second section 120 respectively have a concave arc shape, and the first edge section 110 and the second edge section 120 are symmetrical with respect to the locating portion 130.

Figure 39:
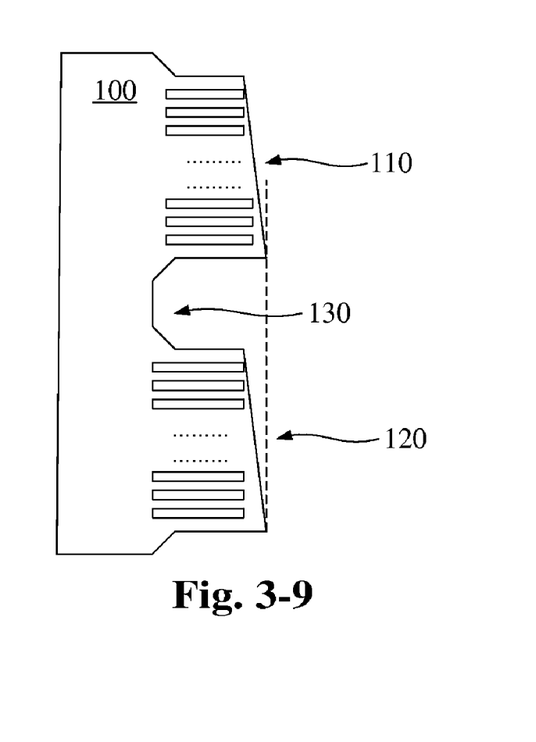

In FIG. 3-9, the first edge section 110 and the second section 120 respectively have a tilted shape, and the first edge section 110 and the second edge section 120 present a staircase shape.

Figure 41:
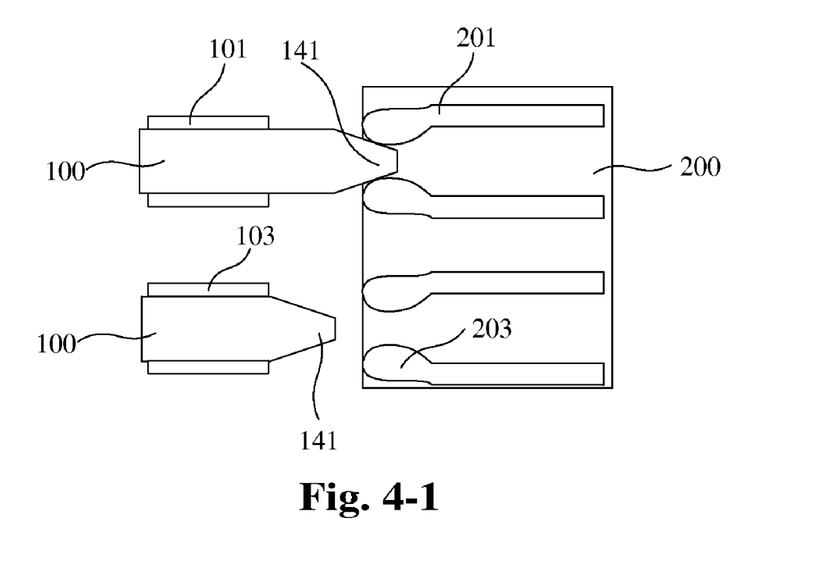
Figure 42:
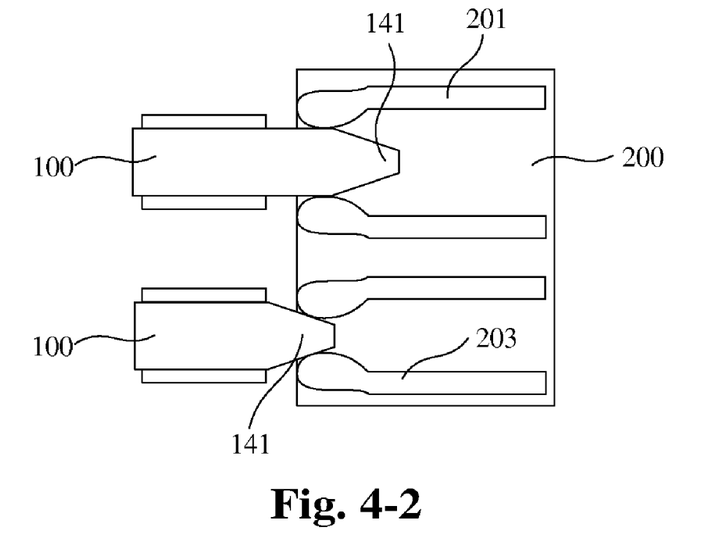
Figure 43:
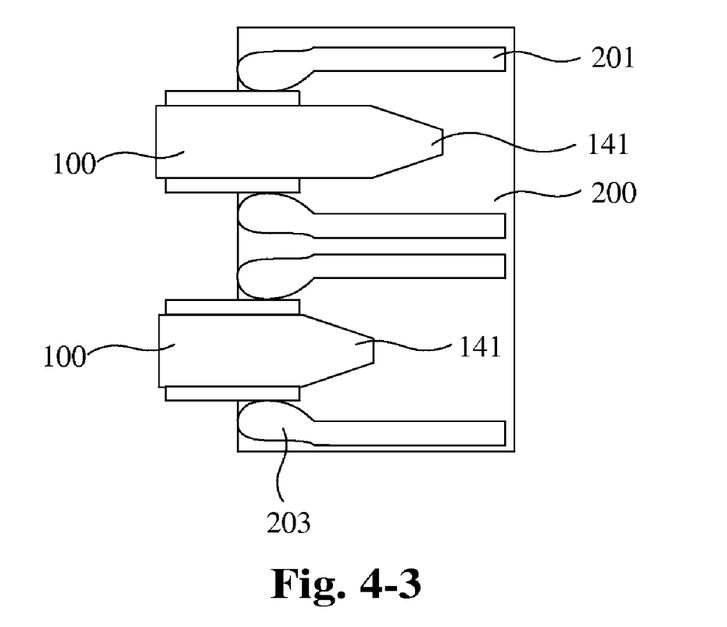

The principle of the method of the present application can be explained by the sectional views shown in FIGS. 4-1 to 4-3. The two golden fingers in FIGS. 4-1 to 4-3 are shown as un-overlapped and in different planes for the purpose of clarity. In the first travel (FIG. 4-1), the connector reeds 201, 203 only contact with the longer PCB and the golden finger 101, that is to say, only part of the opening resistance is added. In the second travel (FIG. 4-2), the reeds 201 in the protruded area have been opened and entered into a sliding state, while the reeds 203 in the recessed area are to be opened and there exists an opening force, thus in this travel, the total resistance=part of the opening force+sliding friction force. In the third travel (FIG. 4-3), all of the reeds 201, 203 are opened, and the resistance=sliding friction force.

Therefore, in all of the travels, the resistance in the second travel is maximum, however, which is far less than the traditional instantaneous maximum resistance.

The improved effects are different for different profiles. Among various shapes shown in FIG. 3, the shape shown in FIG. 3-1 (right angle 2-step staircase shape edge) can improve the effect by approximately 50%, and the shapes shown in FIGS. 3-2 to 3-9 (tilted edge) can improve the effect by more than 50%.

In FIGS. 4-1 to 4-3, the edge 141 of the PCBs 100 is beveled, which is helpful to further reduce the maximum fitting thrust.

Figure 5:
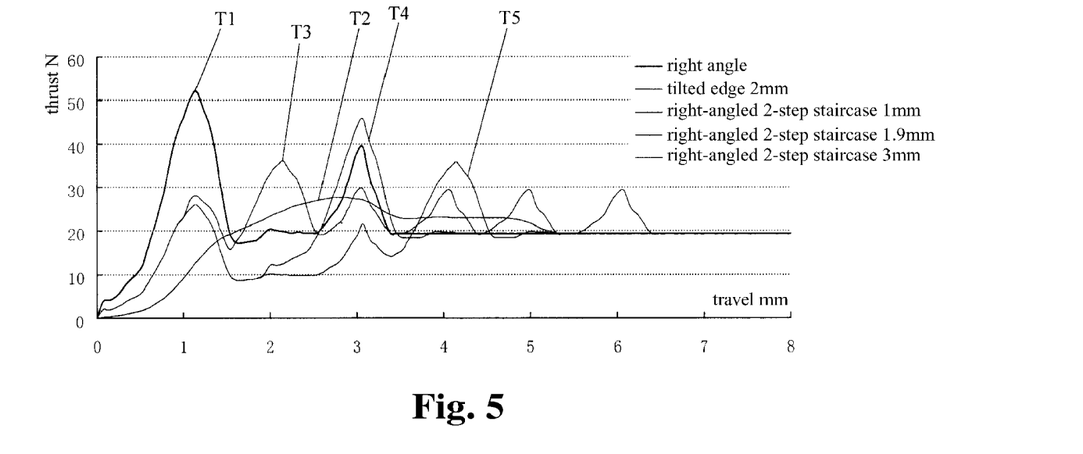
FIG. 5 is a graph plotting the thrusts in different edge shapes.

FIG. 5 shows a graph for comparing and analyzing the thrusts in different shapes. As seen from the figure, T1 represents the resistance curve of the PCB with a straight edge in the prior art when being fit, T2 represents the thrust curve of the PCB with a 2 mm tilted edge, T3 represents the resistance curve of the PCB with a 1 mm right-angled 2-step staircase edge, T4 represents the resistance curve of the PCB with a 1.9 mm right-angled 2-step staircase edge, and T5 represents the resistance curve of the PCB with a 3 mm right-angled 2-step staircase edge. From which, the following can be concluded:
(1) all of the edge shapes have improved effects regarding the maximum thrust, and the levels of improvement are different for different shapes. It is because that all the solutions can distract the traditional concentrated energy.
(2) for right-angled staircase edge, the distance between 2 or more steps of staircase can be optimized according to actual thrust distribution graphs, so as to obtain one or more optimal values.
(3) theoretically, the tilted edge has a greater improvement than the right-angled edge.

Figure 61:
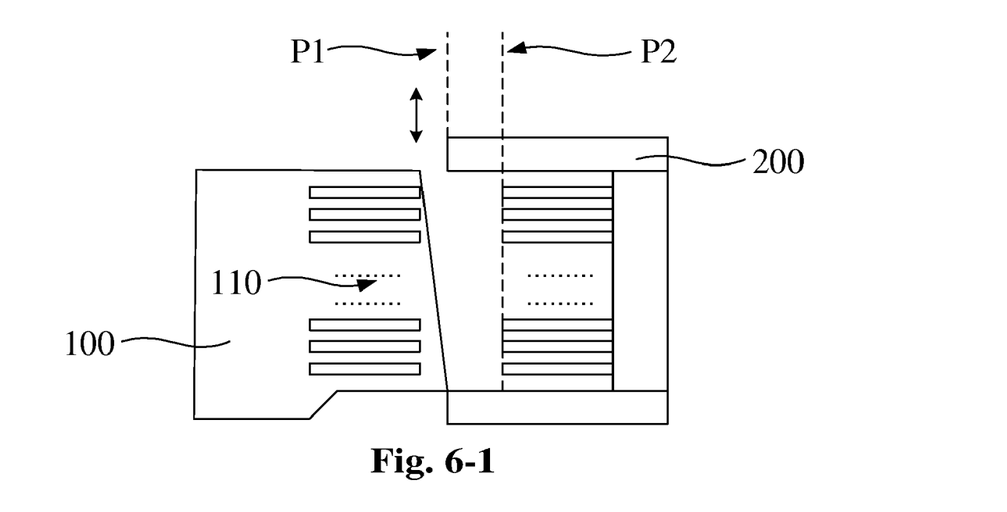
Figure 62:
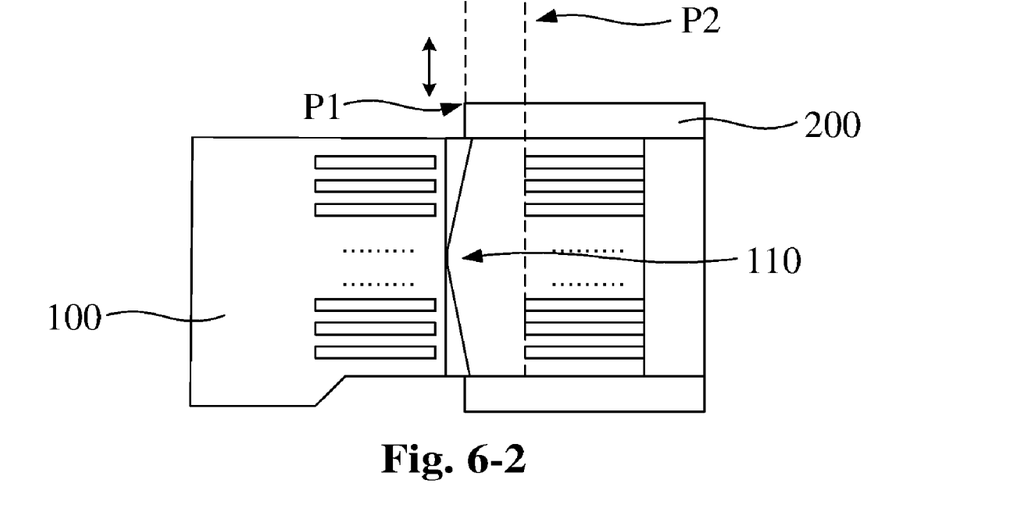
Figure 63:
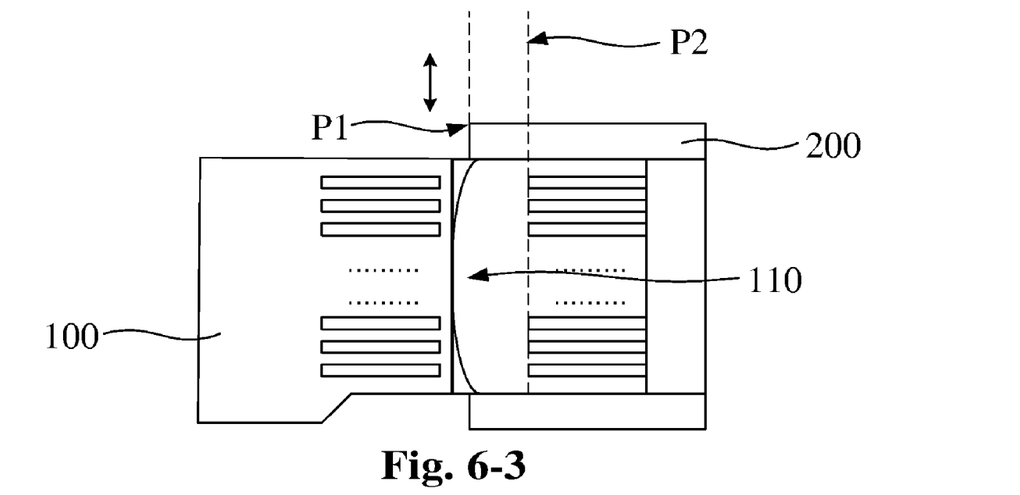
Figure 81:
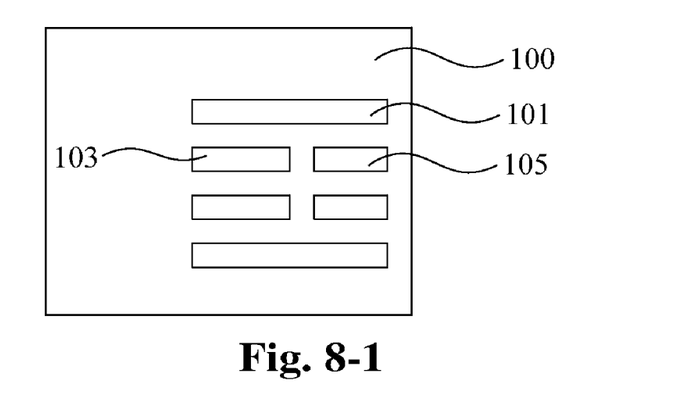

Due to the above modification, a poor guide effect may occur in the case of a single connector, as shown in FIGS. 6-1 to 6-3, wherein FIG. 6-1 shows a unidirectional tilted edge, therefore a fitting error may occur when the connector 200 and the PCB 100 begin to contact due to the freedom in vertical direction. By employing a concave shape, the fitting error may be avoided, as shown in FIGS. 6-2 and 6-3.

If there is a plurality of connectors, as shown in FIGS. 3-1 to 3-9, the locating relationships among the plurality of connectors can be used for locating.

Figure 7:
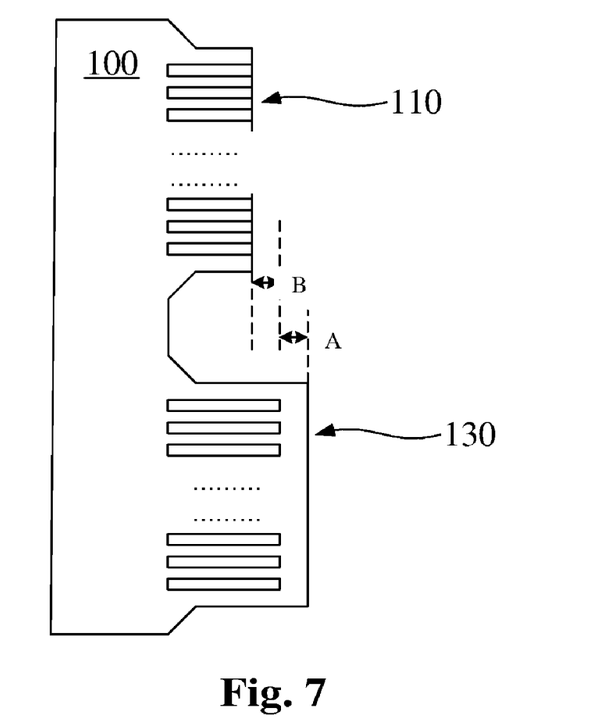
FIG. 7 shows a staircase-like edge.

The method requires some space in the right-left direction to realize the buffer action to the thrust. The above space is obtained by extending outside and contracting inside. Take the shape shown in FIG. 3-1 as an example, the schematic diagram as shown in FIG. 7 can be derived, wherein P1 is the boundary of the connector, P2 is the force applied point of the reeds. Dimension A is the extension with respect to the standard dimension, and dimension B is the contraction with respect to the standard dimension. Herein, only the shape shown in FIG. 3-1 is explained as an example, and the extending and the contracting of the other shapes are similar.

There arises a problem to realize the contraction, according to the definition of the standards, any contraction will impair the definition of the signal due to the removal of the part of the ends of the golden fingers by the contraction. Therefore, the following solution is provided according to the inherent electrical characteristics of the golden finger signal.

The golden fingers may contact with the reeds of the connector at different time, for example, the ground line can be firstly connected, then the power, and then the signal. However, the connections of the power and the ground are to ensure the safety of the device, and there is no large electrical current before all signals being in good connection. Based on this property, it is proposed that one PCB only reserves a few full travel golden finger bonding pads, and the rest of the golden finger bonding pads may contract, which makes it possible to provide a contracting space B.

As to the selection to the shapes of the PCB, such as tilted edge or right-angled edge, the improvement effect to the thrust, the machining difficulty, the guiding, the machining efficiency and so on may be taken into account.

FIG. 8 and FIG. 9 show another method for reducing the thrust, wherein FIG. 8 is a top view, while FIG. 9 is a sectional view. The standard golden fingers of the prior art shown in FIG. 8-1 and FIG. 9-1 have flushed ends. As shown in FIGS. 8-2 and 9-2, the golden fingers are assorted according to the electrical characteristics, wherein some of the pin ends, which need not to be contacted firstly, are not manufactured to be the golden fingers.

Figure 82:
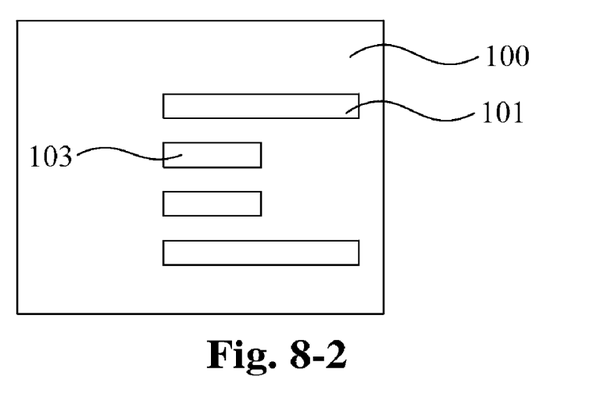
Figure 91:
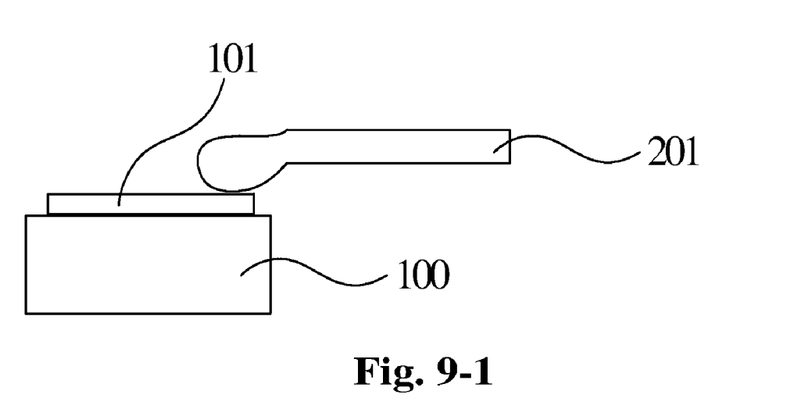
Figure 92:
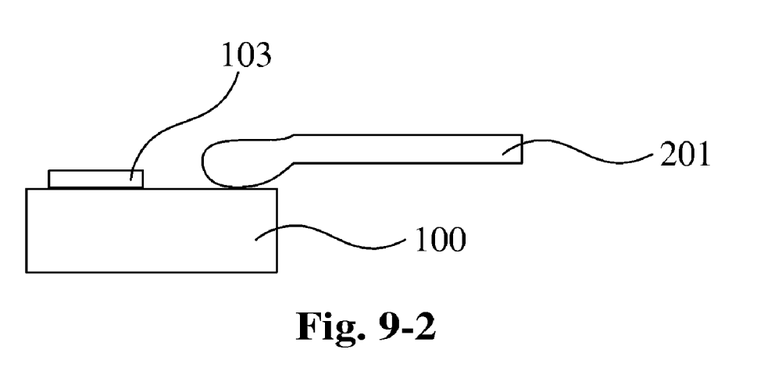

Thus, the reeds will contact the golden finger coatings of different length at different time rather than at the same time.

At the same time, the competitive thickness is reduced due to without applying coatings, which is helpful for reducing the thrust.

Figure 10:
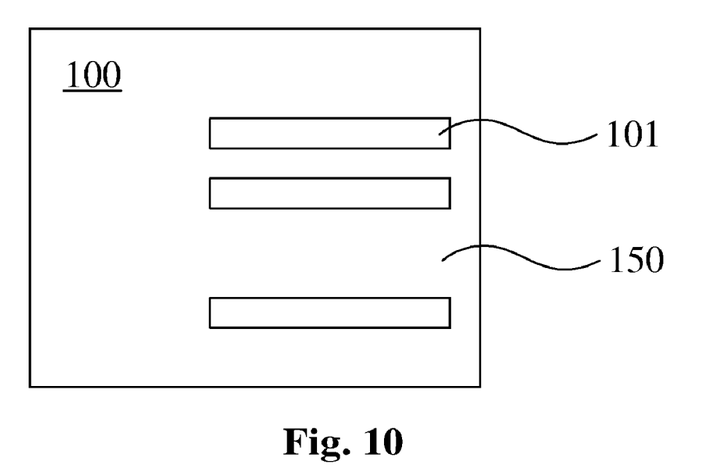
FIG. 10 is a schematic diagram showing the PCB with a un-golden finger pin area.

For a golden finger which is not used in the current circuits, the whole golden finger can be omitted, as shown in FIG. 10 by reference number 150, which will further reduce the thrust.

Figure 111:
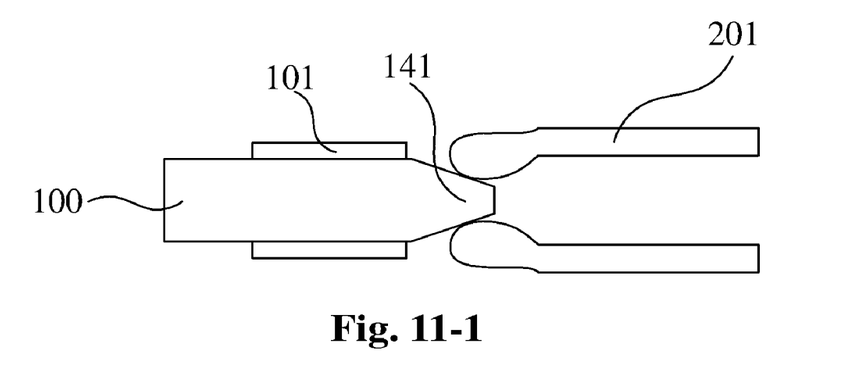
Figure 112:
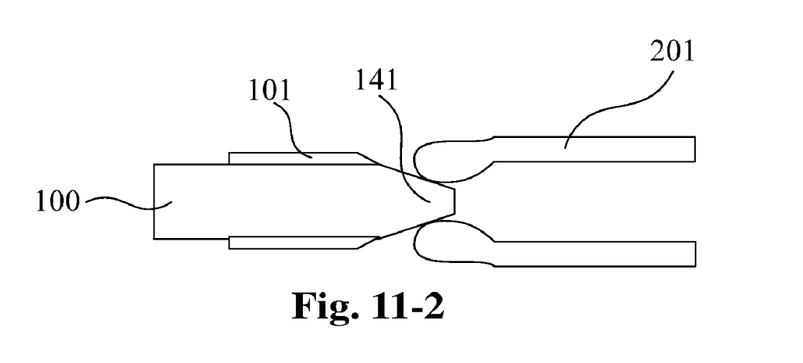

FIGS. 11-1 and 11-2 show the schematic sectional views of the PCB 100 with beveled edge being inserted into the connector reeds. As shown in the figures, the PCB edge has a beveled angle 141 at its longitudinal section, which increase the opening travel for the connector, and the energy releases slowly, and thus the maximum thrust decreases. The beveling may only comprise the PCB 100 without the golden finger portion 101 (as shown in FIG. 11-1), or may comprise both the PCB 100 and the golden finger portion 101.

The methods according to the application described in the context may be utilized separately, or in combination. A superposed improvement effect will be obtained when used in combination.

Above description is to illustrate the preferred embodiments not limit the present invention. Various alterations and changes to the present invention are apparent to those skilled in the art. The scope defined in claims shall comprise any modification, equivalent substitution and improvement in the spirit and principle of the present invention.

Explanation to the reference numbers in drawings

| 100 | PCB |
| --- | --- |
| 101 | golden finger |
| 103 | golden finger |
| 200 | connector |
| 201 | reed |
| 203 | reed |
| 110 | first edge section |
| 120 | second edge section |
| 130 | locating portion |
| 141 | beveled edge |
| 150 | blank area |

The invention claimed is:

1. A method of shaping a printed circuit board (PCB) to reduce a fitting thrust of golden fingers, comprising
modifying a shape of a thickness of an edge of a PCB, wherein said edge includes at least two edge sections along a length of said edge that are separated along said length of said edge by a locating part, and wherein said thickness is transverse to said length, by beveling said at least two edge sections;
modifying a shape of said edge along said length of said edge by shaping said at least two edge sections such that said at least two edge sections open reeds of a connector at different times upon insertion into said connector; and
wherein a plurality of golden fingers are arranged along said at least two edge sections of said PCB, wherein a pin end of at least one of said plurality of golden fingers is removed from a portion of said PCB without removing said portion of said PCB from which said pin end has been removed.

2. The method according to claim 1, wherein said at least two edge sections are configured to comprise at least one concave edge section, at least one convex edge section, or at least one tilted edge section along said length of said edge.

3. The method according to claim 2, wherein said pin ends of one or more of said plurality of golden fingers are removed and pin ends of others of said plurality of some golden fingers are reserved.

4. The method according to claim 1, wherein said at least two edge sections are configured to comprise two concave edge sections, two convex edge sections, or two tilted edge sections with a same shape along said length of said edge, wherein said two concave edge sections, said two convex edge sections, or said two tilted edge sections are symmetrical with respect to said locating part of said PCB.

5. The method according to claim 1, wherein said edge of said PCB along said length of said edge is arranged in a staircase shape.

6. The method according, to claim 1, wherein when said pin end of said one or more of said plurality of golden fingers is removed, and a pin end of one or more others of said plurality of golden fingers is reserved.

7. The method according to claim 1, wherein, on said PCB, while said pin end of at least one of said plurality of golden fingers is removed, at least one of: the at least one of the plurality of golden fingers is removed; and pin end of at least another one of the plurality of golden fingers, is reserved.

8. A printed circuit board (PCB) for reducing fitting thrust of golden fingers, said PCB comprising:
an edge including two or more edge sections along a length of said PCB, wherein said two or more edge sections are beveled across a thickness of said edge transverse to said length of said edge and are separated from another of said two or more edge sections along said length of said edge by a locating part, and wherein said two or more edge sections are shaped along said length of said edge of said PCB such that upon being inserted into a connector having a plurality of reeds, said two or more edge sections engage and open said plurality of reeds at different times; and
a plurality of golden fingers positioned along said length of said edge on said two or more edge sections of said PCB, wherein at least a portion of one of said plurality of golden fingers is removed from each of said two or more edge sections of said PCB without removing a portion of said two or more edge sections of said PCB.

9. The PCB for reducing said fitting thrust of golden fingers according to claim 8, wherein ends of more than one of said plurality of golden fingers on said edge of said PCB are located at different insertion locations to open said plurality of reeds of said connector at different times.

10. The PCB for reducing said fitting thrust of golden fingers according to claim 9, wherein, along said length of said edge of said PCB, said edge of said PCB has at least one concave edge section, at least one convex edge section, or at least one tilted edge section which is different from a locating part between said two or more edge sections along said length of said edge of said PCB.

11. The PCB for reducing said fitting thrust of golden fingers according to claim 10, characterized in that a portion of said edge of said PCB comprises an area in which a whole golden finger is removed.

12. A method of forming printed, circuit board (PCB) configured to reduce fitting thrust of a plurality of golden fingers mounted along at least two edge sections of a surface of the PCB, the method comprising:
beveling at least two edge sections of a PCB to change a thickness of an edge of the PCB transverse to a length of the edge of the PCB;
shaping the at least two edge sections of the PCB along the length of the edge of the PCB such that the at least two edge sections open reeds of a connector configured to receive the PCB at different times as the PCB is coupled to the connector, wherein at least one of the at least two edge sections includes a concave edge section or a convex edge section; and
removing a pin end of one or more of the plurality of golden fingers from each of the at least two edge sections without removing a part of the PCB from which the pin end has been removed,
wherein the at least two edge sections are separated by a locating part.

13. A printed circuit board (PCB), comprising:
at least two edge sections separated by a locating part, wherein:
the at least two edge sections are beveled to facilitate opening reeds of a connector configured to receive the PCB; and
the at least two edge sections are shaped along the length of the edge of the PCB such that the at least two edge sections are configured to open reeds of a connector configured to receive the PCB at different times as the PCB is coupled to the connector, wherein at least one of the at least two edge sections includes a concave edge section or a convex edge section; and
a plurality of golden fingers mounted on a surface of each of the at least two edge sections,
wherein a pin end of one or more of the plurality of golden fingers has been removed without removing a part of the PCB from which the pin end has been removed.

* * * * *